Figure 1:
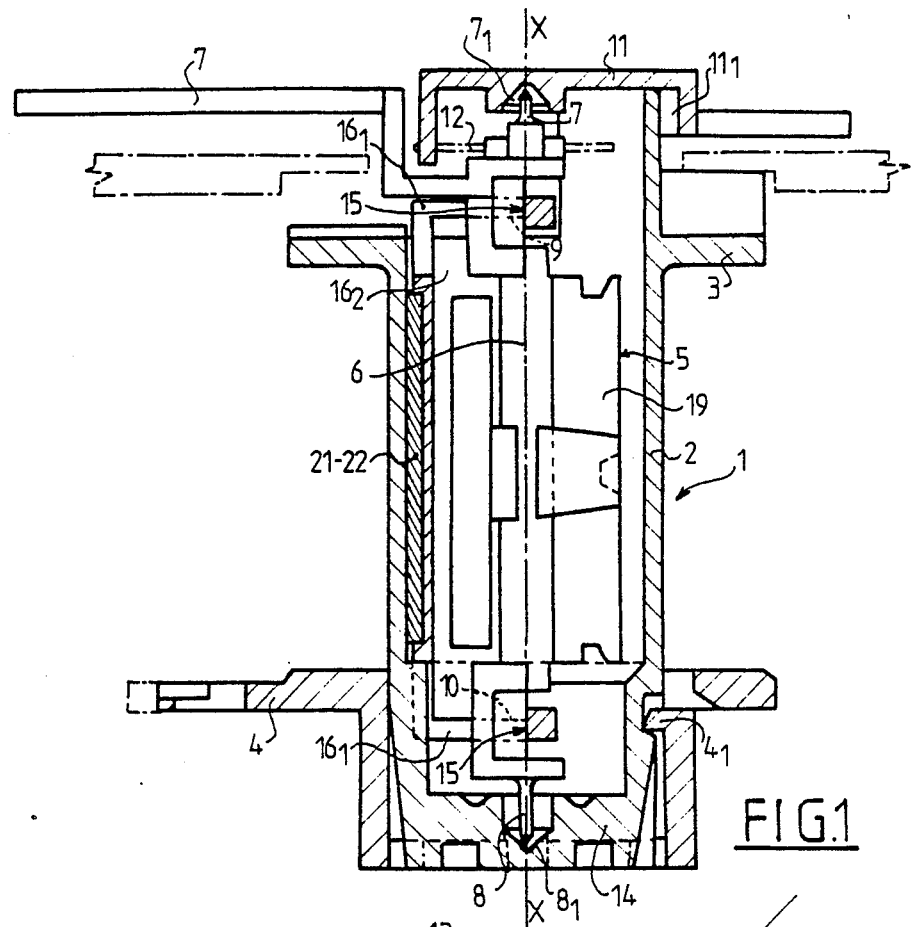

United States Patent [19]

Palencher et al.

[11] Patent Number: 4,933,632
[45] Date of Patent: Jun. 12, 1990

[54] APPARATUS FOR FERROMAGNETIC MEASUREMENTS OF ELECTRICAL QUANTITIES

[75] Inventors: Jacques Palencher, Troyes; Gabriel Jaillant, Creney Pont Sainte Marie, both of France

[73] Assignee: Radio Controle S.A., Lyons, France

[21] Appl. No.: 361,933

[22] Filed: Jun. 5, 1989

[30] Foreign Application Priority Data

Jun. 6, 1988 [FR] France ................................ 88 07489

[51] Int. Cl.$^5$ .......................... G01R 1/02; G01R 1/14
[52] U.S. Cl. .................................... 324/125; 324/152; 324/155; 324/156
[58] Field of Search ................ 324/144, 110, 125, 131, 324/143, 146, 147, 154 R, 154 PB, 155, 156, 152

[56] References Cited

U.S. PATENT DOCUMENTS

| | | | |
|---|---|---|---|
| 2,353,618 | 7/1944 | Lamb | 324/152 |
| 2,515,375 | 7/1950 | Kelly | 324/143 |
| 2,668,945 | 2/1954 | Pfeffer | 324/152 |
| 2,708,737 | 5/1955 | Skidmore | 324/152 |
| 3,713,024 | 1/1973 | Banus | 324/154 X |

FOREIGN PATENT DOCUMENTS 3738331 6/1988 Fed. Rep. of Germany ...... 324/125

Primary Examiner—Reinhard J. Eisenzopf
Assistant Examiner—Jack B. Harvey
Attorney, Agent, or Firm—Helfgott & Karas

[57] ABSTRACT

An apparatus for ferromagnetic measurements of electric quantities comprises a coil having a hollow barrel on which a winding of a conductive wire is formed. A unit which is integral with a needle is positioned in the barrel. The needle is displaced in front of a graduated dial between a zero value and a maximum value. The movable unit is formed integrally with a first metallic plate which is displaced, in the course of the measurement of an electrical quantity, relative to a second metallic plate which is fixed in the hollow barrel of the coil, as a function of the magnetic field created by the winding. At least one additional metallic plate is fixed in the hollow barrel of the coil, in such a manner as to cooperate with the movable plate to generate therewith a repulsive force in order to brake the pivoting of the pivotable unit when the electrical quantity to be measured tends to displace the needle of the movable unit beyond the maximum value of the graduation.

6 Claims, 1 Drawing Sheet

APPARATUS FOR FERROMAGNETIC MEASUREMENTS OF ELECTRICAL QUANTITIES

The invention relates to a ferromagnetic measurement apparatus.

Measurement apparatuses are already known which are referred to as "motor scale" apparatuses, the graduated dial of which, in front of which the indicating needle is displaced, is extended, beyond the maximum value of the graduation, by a zone which is not graduated but which may be reached by the needle when the apparatus has flowing through it a transient excess current such as that which appears when a motor is started up.

This arrangement permits the mechanical abutment of the needle to be brought back beyond this zone referred to as the motor scale zone of the dial, in order to prevent or at the very least to reduce the violence of the shock of the needle against this mechanical abutment at the end of the stroke in the course of a transient excess current.

The object of the present invention is to provide improvements to these apparatuses, and the subject of the invention is, to this end, a ferromagnetic measurement apparatus comprising a coil provided with a hollow barrel and on which a winding of a conductive wire is formed, a movable unit, integral with a needle, which is displaced in front of a graduated dial between a zero value and a maximum value, this movable unit being integral with a first metallic plate which is displaced, in the course of the measurement of an electrical quantity. In relation to a second metallic plate fixed in the hollow barrel of the coil, as a function of the magnetic field created by the winding, the apparatus being characterized in that it comprises a third metallic plate fixed in the hollow barrel of the coil, in such a manner as to cooperate with the movable plate to brake the pivoting of the movable unit when the electrical quantity to be measured tends to displace the needle of the movable unit beyond the maximum value of the graduation.

According to another feature of the invention, the third plate is fixed on the internal wall of the hollow barrel.

Figure 2:
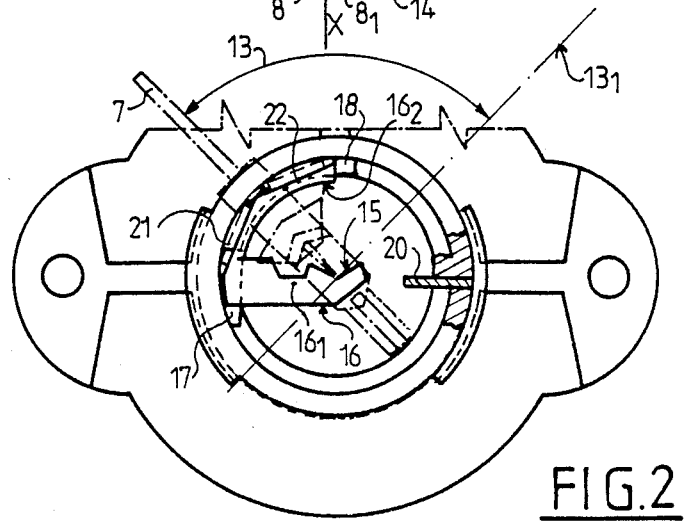

The invention is represented by way of nonlimiting example in the accompanying drawings, in which:

FIG. 1 is an axial diagrammatic crosssectional view of an embodiment of the measurement apparatus according to the invention, FIG. 2 is a view from above of FIG. 1, the zero resetting index of the apparatus being removed and the movable unit being represented in broken lines.

The ferromagnetic apparatus represented in the accompanying drawings comprises a coil 1, the hollow barrel 2 of which is constructed in a single piece by moulding of a plastic material, with the upper flange 3, the lower flange 4 being locked at $4_1$ onto the base of the barrel 2.

The movable unit 5 comprises a shaft 6 integral with the indicating needle 7, this movable unit being, in the example represented, mounted to pivot about the axis X—X, on the one hand by means of end pivoting tips 7 and 8, on the other hand by knives 9 and 10 disposed in alignment with these pivoting tips 7 and 8.

To this end, the pivoting tip 7 cooperates with a conical bearing surface $7_1$ formed in an index 11 mounted to pivot by a bayonet assembly $11_1$ at the end of the barrel 2 of the coil 1. This index 11 is connected to the outer end of the spiral restoring spring 12, the central end of which is immobilized on the shaft 6 of the movable unit. This arrangement permits, by the angular setting of the position of the index 11, the performance of the resetting to zero of the needle 7 on the graduated dial diagrammatically represented at 13 of the apparatus.

The pivoting tip 8 cooperates with a conical bearing surface $8_1$ formed in the bottom 14 of the hollow barrel 2.

The knives 9 and 10 each cooperate with dihedrals 15 formed at the end of the two branches $16_1$ of a calliper 16, the base $16_2$ of which forms approximately a quarter of a circle.

This calliper 16 is mounted in a removable manner within the hollow barrel 2, by axial sliding between two ribs 17 and 18 projecting within the hollow barrel.

The movable unit 5 likewise comprises a metallic plate 19 fixed to the shaft 6 in such a manner as to be situated radially within the hollow barrel 2. Moreover, this hollow barrel 2 likewise comprises a metallic plate 20 fixed radially so as to project within the barrel in a position such that, when the winding of the conductive wire formed on the coil 1 has a current flowing through it, the magnetic field created gives rise, between the metallic plates 19 and 20, to a repulsive force tending to cause pivoting of the needle 7 in front of the graduation 13 by an angle which is a function of the value of the electrical quantity to be measured.

According to the invention, this ferromagnetic measurement apparatus likewise comprises a third metallic plate intended to constitute a magnetic abutment, the purpose of which is to brake and to limit the displacement of the needle beyond the maximum value $13_1$ of the graduation 13, in order thus to avoid in a definite manner any damage to the measurement apparatus when it undergoes a transient excess current.

In the example represented, this third metallic plate is constituted by a double plate 21 and 22 placed tangentially to the internal face of the barrel between the base $16_2$ of the calliper 16 and this internal face of the barrel.

When the needle 7 passes beyond the maximum value $13_1$ of the graduation 13, the repulsive force existing between the plate 19 and the plates 21 and 22 tends to brake and then to prevent the pivoting of the needle 7, this repulsive force begin the greater, the greater is the deflection of the needle 7 beyond the maximum graduation $13_1$.

Of course, the position and the dimension of the metallic plates, as well as the position of the graduations 13 of the dial, will be determined in such a manner as to take into account the combination of the various repulsive forces as a function of the angle of deflection of the needle, it being understood that, beyond the maximum graduation $13_1$, the repulsive force generated by the plates 21 and 22 on the plate 19 becomes extremely preponderant in relation to the repulsive action exerted by the plate 20.

It will likewise be noted that, in the example represented, the fixed third metallic plate is composed of two plates 21 and 22. However, depending upon the values of the quantities measured, and also depending upon the sector covered by the graduation 13, this apparatus may comprise a single plate 21 or 22 disposed in one or the other of the corresponding seatings provided in the external face of the base $16_1$ of the calliper 16.

We claim:

1. In an apparatus for ferromagnetic measurements of electrical quantities comprising a coil including a hollow barrel and a winding of a conductive wire formed thereon, a movable unit adapted to pivot about an axis of the hollow barrel and being integral with a needle which is displaced in front of a graduated dial between a zero value and a maximum value, said movable unit being integral with a first metallic plate which is displaced, in the course of the measurement of an electrical quantity, in relation to a second metallic plate fixed in the hollow barrel of the coil, as a function of the magnetic field created by the winding, the improvement comprising a third metallic plate fixed in the hollow barrel of the coil and cooperating with the first metallic plate to generate between the movable first metallic plate and the third metallic plate a repulsive force which will brake the pivoting of the movable unit when the electrical quantity to be measured tends to displace the needle of the movable unit beyond the maximum value of the graduation so as to prevent a shock of the needle at the end of the course thereof in front of said dial when the apparatus is subjected to a transient excess current.

2. The apparatus according to claim 1, wherein the third plate is fixed on an internal wall of the hollow barrel.

3. The apparatus according to claim 1, wherein the third plate is fixed tangentially against an internal wall of the hollow barrel.

4. The apparatus according to claim 1, wherein the hollow barrel comprises a plurality of seatings to receive, in one of the seatings, the third plate.

5. The apparatus according to claim 1, wherein the movable unit is mounted in the hollow barrel to pivot by pivoting tips in corresponding bearing surfaces and by knives in corresponding additional bearing surfaces, the knives being formed on a calliper accommodated in the hollow barrel, the third metallic plate being retained in the hollow barrel between an internal face thereof and a base of the calliper.

6. The apparatus according to claim 1, wherein the third metallic plate includes two plates fixed tangentially to an internal wall of the hollow barrel.

* * * * *